(12) United States Patent
Yu et al.

(10) Patent No.: US 12,315,580 B2
(45) Date of Patent: May 27, 2025

(54) BUILT-IN SELF-TEST CIRCUITRY (71) Applicant: Micron Technology, Inc., Boise, ID (US)

(72) Inventors: William Yu, Boise, ID (US); Daniele Balluchi, Cernusco Sul Naviglio (IT); Danilo Caraccio, Milan (IT); Thomas T. Tangelder, Boise, ID (US); Jacob S. Robertson, Caldwell, ID (US); James G. Steele, Boise, ID (US); Joemar Sinipete, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 322 days.

(21) Appl. No.: 17/944,135

(22) Filed: Sep. 13, 2022

(65) Prior Publication Data
US 2024/0087663 A1  Mar. 14, 2024

(51) Int. Cl.
*G11C 16/04* (2006.01)
*G11C 29/02* (2006.01)
*G11C 29/36* (2006.01)
*G11C 29/42* (2006.01)

(52) U.S. Cl.
CPC ............ *G11C 29/36* (2013.01); *G11C 29/022* (2013.01); *G11C 29/42* (2013.01); *G11C 2029/3602* (2013.01)

(58) Field of Classification Search
CPC .................. G11C 29/36; G11C 29/022; G11C 2029/3602
See application file for complete search history.

(56) References Cited

U.S. PATENT DOCUMENTS

| | | | |
|---|---|---|---|
| 7,447,953 B2 | 11/2008 | Vogt | |
| 7,721,175 B2* | 5/2010 | Resnick | G11C 29/16 714/733 |
| 7,937,631 B2 | 5/2011 | Vogelsang | |
| 8,456,934 B2 | 6/2013 | Best et al. | |
| 8,914,688 B2 | 12/2014 | Belansek et al. | |
| 8,924,805 B2 | 12/2014 | Sul et al. | |
| 8,988,956 B2 | 3/2015 | Chopra | |
| 9,679,664 B2 | 6/2017 | Ong | |
| 2003/0120974 A1* | 6/2003 | Adams | G11C 8/16 714/E11.176 |
| 2012/0198294 A1* | 8/2012 | Nadeau-Dostie | G11C 29/32 714/719 |

* cited by examiner

*Primary Examiner* — Pho M Luu
(74) *Attorney, Agent, or Firm* — Brooks, Cameron & Huebsch, PLLC (57) ABSTRACT

Methods, systems, and devices related to built-in self-test (BIST) circuitry of a controller. The controller can be coupled to multiple memory devices. The BIST circuitry can include registers configured to store burst patterns. The BIST circuitry can perform a BIST operation on the memory devices contemporaneously and using the number of burst patterns.

20 Claims, 4 Drawing Sheets

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| | | | | | | | | | | | | | | | | | | | | | | | | | | | | | | | | BL32 |

470-0 DQ[7:0] 00h 00h 00h 00h 00h 00h 00h 00h 00h 00h 00h 00h 00h 00h 00h 00h 00h 00h 00h 00h 00h 00h 00h 00h 00h 00h 00h 00h 00h 00h 00h 00h

470 PCHK_0: xROW0PATTERN 470-0 DQ[7:0] FFh FFh FFh FFh FFh FFh FFh FFh FFh FFh FFh FFh FFh FFh FFh FFh FFh FFh FFh FFh FFh FFh FFh FFh FFh FFh FFh FFh FFh FFh FFh FFh

PCHK_0: xROW1PATTERN 471-0 DQ[7:0] FFh 00h FFh 00h FFh 00h FFh 00h FFh 00h FFh 00h FFh 00h FFh 00h FFh 00h FFh 00h FFh 00h FFh 00h FFh 00h FFh 00h FFh 00h FFh 00h

471 ROW STRIPES, CELL COL STRIPES: xROW0PATTERN 471-1 DQ[7:0] 00h FFh 00h FFh 00h FFh 00h FFh 00h FFh 00h FFh 00h FFh 00h FFh 00h FFh 00h FFh 00h FFh 00h FFh 00h FFh 00h FFh 00h FFh 00h FFh

ROW STRIPES, CELL COL STRIPES: xROW1PATTERN 472-0 DQ[7:0] 00h 00h 00h 00h 00h 00h 00h 00h 00h 00h 00h 00h 00h 00h 00h 00h 00h 00h 00h 00h 00h 00h 00h 00h 00h 00h 00h 00h 00h 00h 00h 00h

472 IOCHK0: xROW0PATTERN 472-1 DQ[7:0] FFh FFh FFh FFh FFh FFh FFh FFh FFh FFh FFh FFh FFh FFh FFh FFh FFh FFh FFh FFh FFh FFh FFh FFh FFh FFh FFh FFh FFh FFh FFh FFh

IOCHK0: xROW1PATTERN

BUILT-IN SELF-TEST CIRCUITRY

TECHNICAL FIELD

The present disclosure relates generally to semiconductor memory and methods, and more particularly, to apparatuses, systems, and methods of built-in self-test (BIST) circuitry of a controller of a memory module.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes Random Access Memory (RAM), Dynamic Random Access Memory (DRAM), Static Random Access Memory (SRAM), Synchronous Dynamic Random Access Memory (SDRAM), and Thyristor Random Access Memory (TRAM), among others. Non-volatile memory can provide persistent data by retaining stored data when not powered and can include NAND flash memory, NOR flash memory, Ferroelectric Random Access Memory (FeRAM), and resistance variable memory such as Phase Change Random Access Memory (PCRAM), Resistive Random Access Memory (RRAM), and Magnetoresistive Random Access Memory (MRAM), such as Spin Torque Transfer Random Access Memory (STTRAM), among others.

Memory devices may be coupled to a host (e.g., a host computing device) to store data, commands (also referred to as requests), and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

DETAILED DESCRIPTION

Systems, apparatuses, and methods related to built-in self-test (BIST) circuitry of a controller of a memory module are described. Some previous approaches to BIST of memory devices (of a memory module, for example) may utilize firmware (e.g., manufacturing test firmware) to perform BIST operations. However, the cost of testing memory devices using firmware may be two to three times greater than using circuitry to performing BIST operations. Some previous approaches may include each memory device having a respective memory controller and each memory controller having circuitry to perform BIST operations (also referred to herein as BIST circuitry) on the memory device coupled thereto. For example, if a memory module has four memory devices, then the memory module may have four memory controllers. Thus, in some previous approaches, a memory module may include four instances of circuitry to perform BIST operations. Multiple instances of BIST circuitry may increase die sizes and resource consumption of a memory module.

Aspects of the present disclosure address the above and other deficiencies of previous approaches. Some embodiments of the present disclosure include BIST circuitry of a controller coupled to multiple memory devices that can perform BIST operations on the memory devices. In contrast to previous approaches that include multiple instances of BIST circuitry, some embodiments of the present disclosure can include a single instance of BIST circuitry (e.g., within the controller) capable of performing BIST operations on multiple memory devices. Using a single instance of BIST circuitry can reduce die sizes and/or the size of the memory module and/or resource consumption by the memory module without the costs associated with some previous approaches that include performing BIST operations using firmware.

Some embodiments can generate one or more sequences of data (e.g., bits) for BIST operations initiated by a host or firmware of a memory module. Such sequences can be referred to as burst patterns. As used herein, "burst pattern" refers to a sequence of bits written to and/or read from memory to detect problems, damage, and/or defects of the memory device. Embodiments of BIST circuitry described herein can cause one or more burst patterns to be written to one or more memory devices. The BIST circuitry can cause data read from one or more memory devices, such as burst patterns written thereto and verification that the read data corresponds to (e.g., matches) one or more burst patterns. In some embodiments, data read from memory devices of memory module a burst pattern can be evaluated using error correction code (ECC) circuitry of a memory module and/or BIST circuitry of a controller of the memory module. The BIST circuitry can include registers to store one or more burst different patterns from multiples sources (e.g., a host, a user, manufacturer firmware). The BIST circuitry described herein is scalable and compatible with multiple different types of memory devices.

The BIST circuitry can use multiple types of burst patterns, including but not limited to static burst patterns, dynamic burst patterns, and random burst patterns. A non-limiting example of a static burst pattern is a user-defined burst pattern. A non-limiting example of a dynamic burst pattern is a burst pattern based on a topography of a memory device. Random burst patterns can be generated by a pseudorandom bit sequence (PRBS) generator, for example. In some embodiments, the BIST circuitry can generate burst patterns. For instance, a controller can include a PRBS generator coupled to BIST circuitry. Other non-limiting examples of burst patterns include march patterns, walking patterns, and row hammer.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. The terms "data" and "data values" are used interchangeably herein and can have the same meaning, as appropriate to the context.

The figures herein follow a numbering convention in which the first digit or digits correspond to the drawing figure number and the remaining digits identify an element or component in the drawing. Similar elements or components between different figures may be identified by the use of similar digits. For example, element 107 can represent element 7 in FIG. 1, and a similar element can be labeled 207 in FIG. 2. Analogous elements within a figure may be referenced with a hyphen and extra numeral or letter. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
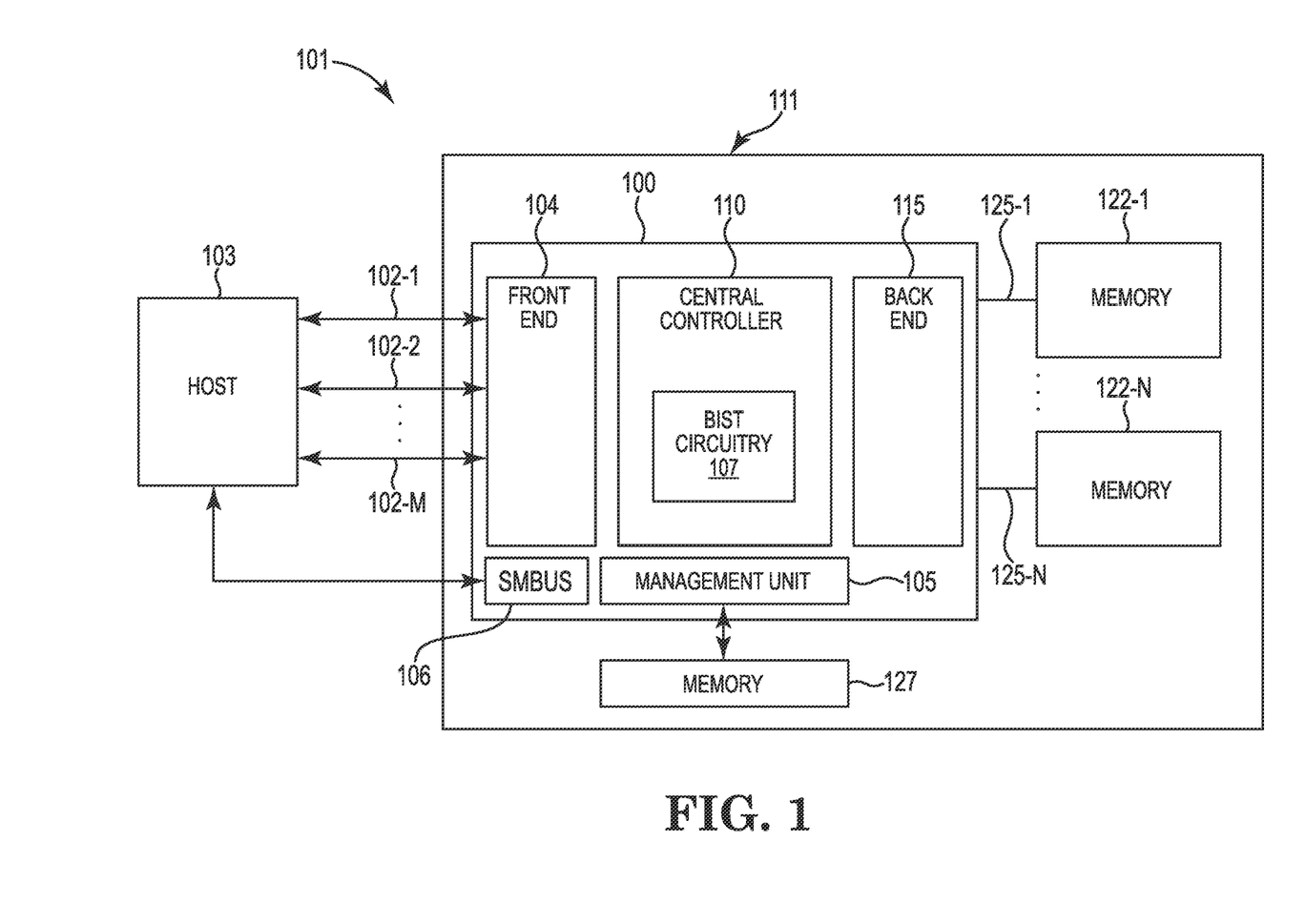
FIG. 1 illustrates a functional block diagram in the form of a computing system including a memory module including a controller including built-in self-test (BIST) circuitry in accordance with a number of embodiments of the present disclosure.

FIG. 1 illustrates a functional block diagram in the form of a computing system 101 including a memory module 111 including a controller 100 (which may be referred to as a "memory controller") including BIST circuitry 107 in accordance with a number of embodiments of the present disclosure. The computing system 101 includes a memory module 111. The memory module 111 can include the controller 100 and one or more memories and/or memory devices coupled thereto.

The controller 100 can include a front end portion 104, a central controller portion 110, and a back end portion 115. The computing system 101 can further include a host 103, memory devices 122-1, . . . , 122-N(collectively referred to as memory devices 122), and a memory 127. The memory 127 can be a flash memory accessible via a serial peripheral interface (SPI). The memory 127 can include other circuitry, firmware, software, or the like, whether alone or in combination.

The front end portion 104 includes an interface to couple the controller 100 to the host 103 through input/output (I/O) lanes 102-1, 102-2, . . . , 102-M (collectively referred to as I/O lanes 102). The front end portion 104 includes interface management circuitry to manage the I/O lanes 102. The front end portion 104 can include any quantity of the I/O lanes 102 (e.g., eight, sixteen I/O lanes 102). In some embodiments, the I/O lanes 102 can be configured as a single port. In some embodiments, the interface between the controller 100 and the host 103 can be a Peripheral Component Interconnect express (PCIe) physical and electrical interface operated according to a Compute Express Link (CXL) protocol.

In some embodiments, the computing system 101 can be a CXL compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as I/O protocol, memory protocol (e.g., initially allowing a host to share memory with an accelerator), and coherency interface.

The back end portion 115 can include media control circuitry and a physical (PHY) layer that couples the controller 100 to the memory devices 122. As used herein, the term "PHY layer" generally refers to the physical layer in the Open Systems Interconnection (OSI) model of a computing system. The PHY layer can be the first (e.g., lowest) layer of the OSI model and used to transfer data over a physical data transmission medium. In some embodiments, the physical data transmission medium can include channels 125-1, . . . , 125-N(collectively referred to as the channels 125). The channels 125 can include a sixteen-pin data bus and a two pin data mask inversion (DMI) bus, for example, among other possible buses. The channels 125 can each include an input/output data (DQ) bus and a data strobe (DQS) bus. The back end portion 115 can communicate (e.g., transmit and/or receive) data to and/or from the memory devices 122 via the data pins.

One or more of the memory devices 122 can include DRAM. DRAM can be operated according to a protocol, such as low-power double data rate (LPDDRx), (e.g., LPDDRx DRAM devices, LPDDRx memory, etc.). The "x" in LPDDRx refers to any of a number of generations of the protocol (e.g., LPDDR5). In some embodiments, at least one of the memory devices 122 is operated as an LPDDRx DRAM device with low-power features enabled and at least one of the memory devices 122 is operated as an LPDDRx DRAM device with at least one low-power feature disabled. In some embodiments, the memory devices 122 are LPDDRx memory devices, but the memory devices 122 do not include circuitry configured to provide low-power functionality, such as a dynamic voltage frequency scaling core (DVFSC), a sub-threshold current reduce circuit (SCRC), or other low-power functionality providing circuitry. The LPDDRx memory devices 122 without such circuitry can advantageously reduce the cost, size, and/or complexity of the LPDDRx memory devices 122. By way of example, an LPDDRx memory device with reduced low-power functionality providing circuitry can be used for applications other than mobile applications (e.g., if the memory is not intended to be used in a mobile application, some or all low-power functionality can be sacrificed for a reduction in the cost of producing the memory). One or more of the memory devices 122 can include FeRAM, PCRAM, RRAM, MRAM, and STTRAM, among others.

The memory devices 122 are not limited to a particular type of memory device. For instance, the memory devices 122 can include RAM, ROM, DRAM, SDRAM, PCRAM, RRAM, and flash memory, among others. The memory devices 122 can include non-volatile memory devices such as non-volatile random-access memory devices (e.g., NVRAM, ReRAM, FeRAM, MRAM, PCM), "emerging" memory devices such as a ferroelectric RAM device that includes ferroelectric capacitors that can exhibit hysteresis characteristics, a 3-D Crosspoint (3D XP) memory device, etc., or combinations thereof.

As an example, a FeRAM device can include ferroelectric capacitors and can perform bit storage based on an amount of voltage or charge applied thereto. In such examples, relatively small and relatively large voltages allow the ferroelectric RAM device to exhibit characteristics similar to normal dielectric materials (e.g., dielectric materials that have a relatively high dielectric constant) but at various voltages between such relatively small and large voltages the FeRAM device can exhibit a polarization reversal that yields non-linear dielectric behavior.

As another example, a 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation in which a non-volatile memory cell can be programmed without the non-volatile memory cell being previously erased.

In some embodiments, the controller 100 can include a management unit 105 to initialize, configure, and/or monitor characteristics of the controller 100. The management unit 105 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the controller 100. As used herein, the term "out-of-band data and/or commands" generally refers to data and/or commands transferred through a transmission medium that is different from the main transmission medium of a network. For example, out-of-band data and/or commands can be data and/or commands transferred to a network using a different transmission medium than the transmission medium used to transfer data within the network.

As illustrated by FIG. 1, the controller 100 can include a System Management Bus (SMBus) 106. As used herein, "SMBus" generally refers to a single-ended simple two-wire bus to provide lightweight communication between the host 103 and the controller 100. In some embodiments, the SMBus 106 can communicate signaling indicative of a BIST command from the host 103 to the controller 100. The signaling can be indicative of an address of the memory devices 122 associated with a BIST operation and/or one or more burst patterns to use in association with a BIST operation. The address can be a Device Physical Address (DPA) used for write and/or read operations associated with a BIST operation so as to emulate system addressing. Thus, the BIST circuitry 107 can provide the ability to test one or more of the memory devices 122 in a manner similar to how an end user may use the memory module 111 (e.g., based on codeword address architecture rather than a DRAM native address).

The central controller portion 110 can control, in response to receiving a memory access request from the host 103, for example, performance of one or more memory operations. Non-limiting examples of memory operations include a memory operation to read data from a memory device 122 and an operation to write data to a memory device 122. In some embodiments, the central controller portion 110 can control writing of multiple pages of data substantially simultaneously.

As used herein, the term "substantially" intends that the characteristic may not be absolute, but is close enough so as to achieve the advantages of the characteristic. For example, "substantially simultaneously" and "contemporaneously" are not limited to operations that are performed absolutely simultaneously and can include timings that are intended to be simultaneous but due to manufacturing limitations may not be precisely simultaneously. For example, due to read/write delays that may be exhibited by various interfaces, media controllers that are utilized "contemporaneously" may not start or finish at exactly the same time. For example, the multiple memory controllers can be utilized such that they are writing data to the memory devices at the same time regardless if one of the media controllers commences or terminates prior to the other.

The central controller portion 110 can include BIST circuitry 107. However, in some embodiments, the BIST circuitry 107, or a portion thereof, can be a component of the controller 100 other than the central controller portion 110 or external to the controller 100. The BIST circuitry 107 can include one or more registers to store burst patterns. One or more of the registers can store burst patterns associated with write operations of BIST operations (also referred herein to as write burst patterns). One or more of the registers can store burst patterns associated with read operations of BIST operations (also referred herein to as read burst patterns). The BIST circuitry 107 can perform BIST operations on one or more of the memory devices 122 contemporaneously. In some embodiments, the functionality of the BIST circuitry 107 described herein can be implemented in firmware, hardware, and combinations thereof.

Figure 2:
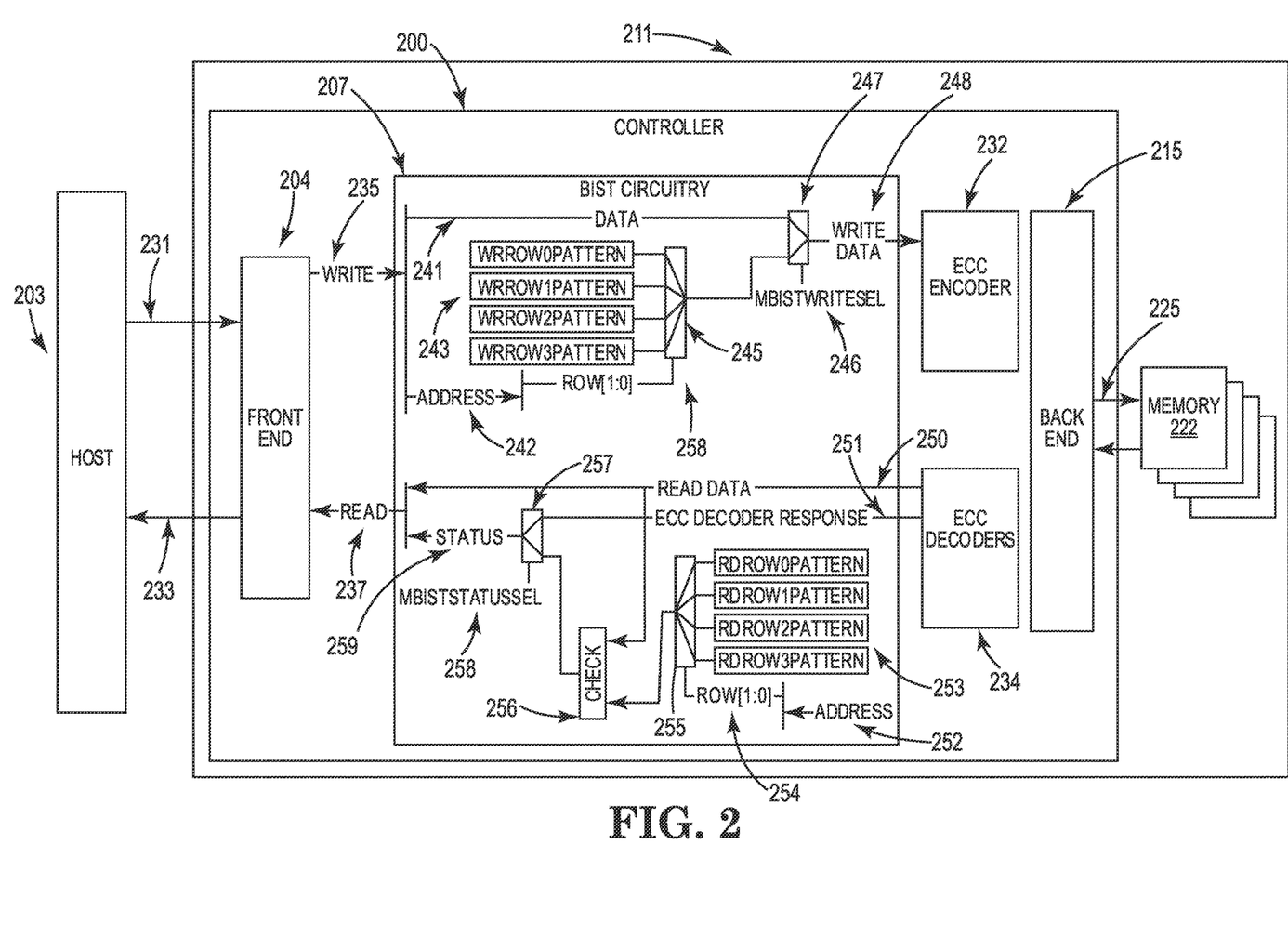
FIG. 2 illustrates a block diagram of an example of BIST circuitry of a controller in accordance with a number of embodiments of the present disclosure.

FIG. 2 illustrates a block diagram of an example of BIST circuitry 207 of a controller 200 in accordance with a number of embodiments of the present disclosure. For clarity, FIG. 2 has been simplified to focus on the BIST circuitry 207. The host 203, front end portion 204, BIST circuitry 207, back end portion 213, and memory devices 222 can be analogous to the host 103, front end portion 104, BIST circuitry 107, back end portion 113, and memory devices 122 described in association with FIG. 1. FIG. 2 does not illustrate a "box" for the central controller portion of the controller 200 for clarity. However, the BIST circuitry 207 illustrated by FIG. 2 is a component of the central controller portion of the controller 200.

The BIST circuitry 207 illustrated by and described in association with FIG. 2 is a non-limiting example. The BIST circuitry 207 includes registers to store burst patterns. However, at least one embodiment of the present disclosure includes BIST circuitry configured to generate one or more burst patterns, and may or may not include components (e.g., registers) to store generated burst patterns. The burst patterns can be generated according to a BIST command and/or a burst configuration command as described herein. Random burst patterns can be generated by a PRBS generator, for example, coupled to or a component of (e.g., internal to) the BIST circuitry. However, embodiments of the present disclosure are not limited to generating burst patterns via PRBS generator. In some embodiments, the BIST circuitry can receive burst patterns from one or more sources that are external to and/or internal to the BIST circuitry.

The BIST circuitry 207 can include a number of registers 243 to store write burst patterns. FIG. 2 illustrates four registers 243; however, embodiments of the present disclosure are not so limited. The registers 243 can include fewer than or greater than four registers. Each of the registers 243 can store a different write burst pattern. A command to perform a BIST operation (also referred to herein as a BIST command), as well as write commands and read commands, can be received by the controller 200 from the host 203 at 231 (e.g., via one or more of the I/O lanes 102 described in association with FIG. 1). A BIST command can be received as a bit string. As used herein, "BIST command" refers to signaling and/or instructions indicative of write operations and/or read operations to perform in association with a BIST operation and "BIST configuration command" refers to signaling and/or instructions indicative of configurations of the BIST circuitry 207, a type of BIST operation, and/or how to perform a BIST operation. Although a BIST command is described separately from a BIST configuration command for clarity, a BIST command and a BIST configuration command can be communicated to the BIST circuitry 207 together (e.g., intermingled).

The front end portion 204 can be an interface between the host 203 and the controller 200 (e.g., the central controller portion). A write command can be received, at 235, by the BIST circuitry 207. A write command can be in association with a BIST command or independent of (not associated with) a BIST command. A write command can include, at 241, data to be written to one or more of the memory devices 222 and, at 242, an address at which the data or a write burst pattern is to be written.

The BIST circuitry 207 can include a multiplexer (MUX) 245 coupled to the registers 243. A BIST command can include an indication of which and/or how many burst patterns to write to one or more of the memory devices 222. As indicated at 258, an address of the memory devices 222, or a portion thereof, can be provided to the MUX 245 as a selection signal. For example, if a BIST command indicates that a single write burst pattern is to be used, then the burst pattern stored in WrRow0Pattern register of the registers 243 can be selected. If a BIST command indicates that two write burst patterns are to be used, then the burst patterns stored in WrRow0Pattern and WrRow1Pattern registers of the registers 243 can be selected. If a BIST command indicates that four write burst patterns are to be used, then the burst patterns stored in WrRow0Pattern, WrRow1Pattern, WrRow2Pattern, and WrRow3Pattern registers of the registers 243 can be selected.

The BIST circuitry 207 can include another MUX 247. Data to be written to one or more of the memory devices 222 (independent of a BIST command, for example) can be an input of the MUX 247. The output of the MUX 245 (one or more write burst patterns) can be another input of the MUX 247. A selection signal (MBISTwriteSel) 246 provided to the MUX 247 that is indicative of whether, at 248, the data or one or more write burst patterns is output by the MUX 247 is to be output by the BIST circuitry 207. For example, if the write command is independent of a BIST command, then the selection signal 246 can be such that the data, at 241, is selected. If the write command is associated with a BIST command, then the selection signal 246 can be such that the output of the MUX 245 (one or more write burst patterns) is selected.

At 248, the output of the MUX 247 can be input into an error correction code (ECC) encoder 232. However, some embodiments do not include an ECC encoder. The ECC encoder 232 is illustrated as distinct from the back end portion 215. However, in some embodiments, the ECC encoder 232 can be a component of the back end portion 215. The ECC encoder 232 can be operated based on various types of ECC, such as Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes, among others. As a non-limiting example, the ECC encoder 232 can be operated based on Hamming code and generate parity symbols (as ECC symbols). The ECC encoder 232 can include circuitry and/or firmware in order to perform ECC operations.

Although not illustrated by FIG. 2, the back end portion 215 can include respective memory controllers corresponding to and/or coupled to the memory devices 222. The back end portion 215 can be an interface between the controller 200 (e.g., the central controller portion) and the memory devices 222. The back end portion 215 can be coupled to the memory devices 222 via the channels 225.

The BIST circuitry 207 can include a number of registers 253 to store read burst patterns. FIG. 2 illustrates four registers 253; however, embodiments of the present disclosure are not so limited. The registers 253 can include fewer than or greater than four registers. Each of the registers 253 can store a different read burst pattern. The read burst patterns can be compared to data read from the memory devices 222.

In some embodiments, selection of one or more of the registers 253 can be based on an indication provided by a BIST command or a BIST configuration command, received by the BIST circuitry 207 at 235, (or read command associated with the BIST command). A BIST command can include an indication of which and/or how many burst patterns to compare to data read from one or more of the memory devices 222. In some embodiments, selection of one or more of the registers 253 can be based on an indication stored in a control register (not illustrated by FIG. 2) rather than provided by a BIST command or a BIST configuration command. A MUX 255 can be coupled to the registers 253. As illustrated at 254, an address, or a portion thereof (at 252) of a BIST command, or a read command associated therewith, can be a selection signal provided to the MUX 255. For example, if a BIST command indicates that a single read burst pattern is to be used, then the burst pattern stored in RdRow0Pattern register of the registers 253 can be selected. If a BIST command indicates that two read burst patterns are to be used, then the burst patterns stored in RdRow0Pattern and RdRow1Pattern registers of the registers 253 can be selected. If a BIST command indicates that four read burst patterns are to be used, then the burst patterns stored in RdRow0Pattern, RdRow1Pattern, RdRow2Pattern, and RdRow3Pattern registers of the registers 253 can be selected.

A read command can be received by, at 235, the BIST circuitry 207. The read command can be in association with a BIST command or independent of (not associated with) a BIST command. The read command can include an address (at 252) at which data is to be read. Data read from the memory devices 222 can be input to an ECC decoder 234. However, some embodiments do not include an ECC decoder. The ECC decoder 234 is illustrated as distinct from the back end portion 215. However, in some embodiments, the ECC decoder 234 can be a component of the back end portion 215. The ECC decoder 234 can be operated based on various types of ECC, such as Hamming codes, RS codes, BCH codes, CRC codes, Golay codes, Reed-Muller codes, Goppa codes, and Denniston codes, among others. As a non-limiting example, the ECC decoder 234 can be operated based on Hamming code and decode parity symbols (as ECC symbols). The ECC decoder 234 can include circuitry and/or firmware in order to perform ECC operations. As illustrated at 251, a response can be output from the ECC decoder 234. The response can be indicative of whether data read from the memory devices 222 include an error.

The BIST circuitry 207 can include comparison circuitry 256 (e.g., a comparator) to compare, at 250, data read from the memory devices 222 to the one or more read burst patterns output from the MUX 255. The output of the comparison circuitry 256 can be indicative of whether there is a mismatch between the data and the read burst patterns.

The BIST circuitry 207 can include another MUX 257 that receives, at 251, the response from the ECC decoder 234 and the output of the comparison circuitry 256. A selection signal (MBISTstatusSel) 258 can be provided to the MUX 257 that is indicative of whether, at 259, the response from the ECC decoder 234 or the output of the comparison circuitry 256 is to be output by the BIST circuitry 207. For instance, if data is read in association with a read command independent of a BIST command, then the selection signal 258 can be such that the response from the ECC decoder 234 is output at 259. In contrast, if data is read in association with a BIST command, then the selection signal 258 can be such that the output of the comparison circuitry is output at 259.

As illustrated at 233, a response to a BIST command (as well as responses to write commands and read commands) can be communicated by the controller 200 to the host 203 (e.g., via one or more of the I/O lanes 102). The response to a BIST command can include an indication of whether data read from one or more of the memory devices 222 matches one or more read burst patterns. In some embodiments, write burst patterns, stored in the registers 243, can correspond to (e.g., be the same as) read burst patterns, stored in the registers 253. For example, performing a BIST operation can include performing a write operation to write one or more of the burst patterns stored in the registers 243 to one or more of the memory devices 222 at one or more addresses. Then, a read operation can be performed at the addresses and the read data can be compared, using the comparison circuitry 256, to one or more burst patterns stored in the registers 253. Although FIG. 2 illustrates the registers 243 as distinct from the registers 253, in some embodiments, the registers 243 and 253 can be coupled to one another. In some embodiments in which read burst patterns are the same as write burst patterns, a burst pattern stored in a register can be written to the memory devices 222 as well as compared to data read from the memory devices 222. In some embodiments, writing burst patterns to one or more of the memory devices 222 can occur contemporaneously with reading burst patterns from one or more of the memory devices 222.

Although not illustrated by FIG. 2, the BIST circuitry 207 can include one or more registers associated with control of a BIST operation (also referred to herein as control registers). A BIST configuration command can cause changes to bits stored in a control register. For example, a BIST configuration command can be a bit string stored in a control register. A bit of a control register can cause a write functionality of the BIST circuitry 207 to be enabled. For example, if this bit is set to one, then the BIST circuitry 207 can cause one or more write burst patterns (stored in the registers 243) to be written to the memory devices 222 instead of data received by the controller 200 in association with a write command. A bit of a control register can cause the BIST functionality of the BIST circuitry 207 to be enabled. For example, if this bit is set to one, then the BIST circuitry 207 can cause data read from the memory devices 222 to be compared to one or more read burst patterns (stored in the registers 253). As described herein, if the read data matches the read burst patterns, then the BIST circuitry 207 can output an indication that there are no errors. If the read data does not match the read burst patterns, then the BIST circuitry 207 can output an indication that there is an error (e.g., an uncorrectable error). A bit of a control register can cause ECC circuitry (e.g., the ECC encoder 232 and the ECC decoder 234) to be disabled or enabled. One or more bits of a control register can be indicative of a type of BIST operation to perform. For example, one type of BIST operation can include using a single burst pattern and another type of BIST operation can include using multiple burst patterns. The bits of a control register can indicate which of the write burst patterns stored in the registers 243 to use in association with a BIST operation and/or which of the read burst patterns stored in the registers 253 to use in association with a BIST operation. A bit of a control register can cause the BIST circuitry 207 to write data to the memory devices 222 only in association with a BIST operation. A bit of a control register can cause the BIST circuitry 207 to read data from the memory devices 222 only in association with a BIST operation.

Figure 3:
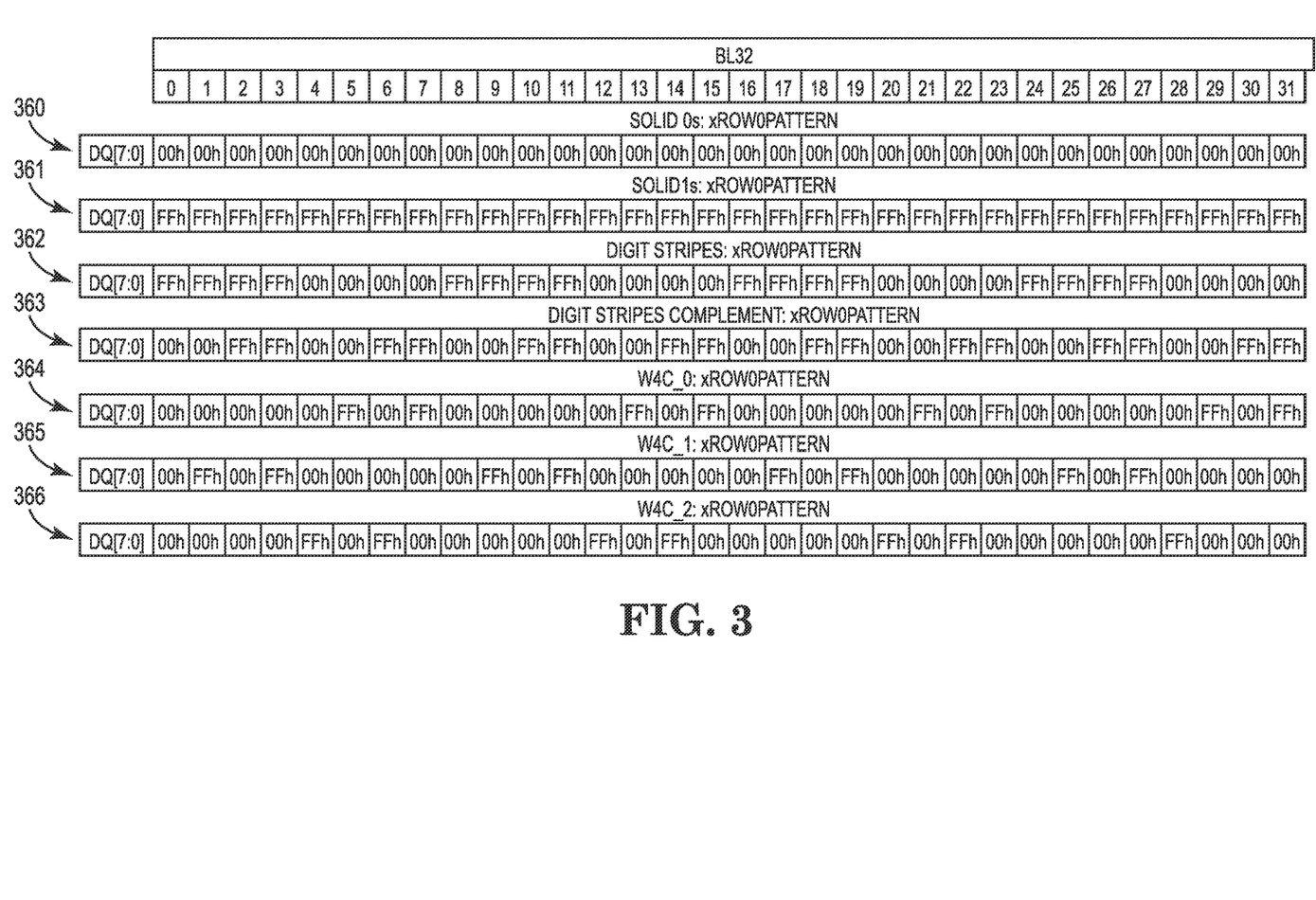
FIG. 3 illustrates example burst patterns used in association with BIST circuitry in accordance with a number of embodiments of the present disclosure.

FIG. 3 illustrates example burst patterns 360, 361, 362, 363, 364, 365, and 366 used in association with BIST circuitry in accordance with a number of embodiments of the present disclosure. The burst patterns 360-366 can be used as write burst patterns (written to a memory device, such as one of the memory devices 222 described in association with FIG. 2) and/or read burst patterns (compared to data read from a memory device, such as one of the memory devices 222). The burst patterns 360-366 are 32 bits long; however, embodiments are not so limited. For example, burst patterns can be less than 32 bits long (e.g., 16 bits) or greater than 32 bits long (e.g., 64 bits). The burst patterns 360-366 can write to and/or read from a memory device via a DQ bus as indicated by DQ[7:0].

The burst patterns 360-366 can be used individually. Any one of the burst patterns 360-366 can be stored in WrRow0Pattern register of the registers 243 (when used as a write burst pattern) and/or RdRow0Pattern register of the registers 253 (when used as a read burst pattern), for example. The burst pattern 361 includes all zeroes (00h). The burst pattern 361 includes all ones (FFh). The burst pattern 362 alternates between zeros (00h) and ones (FFh) for digit line stripes and the burst pattern 363 is the complement of the burst pattern 362. The burst patterns 364-366 include irregular distributions of ones (FFh) and zeroes (00h) where the quantity of ones (FFh) is fewer than the quantity of zeroes (00h).

Figure 4:
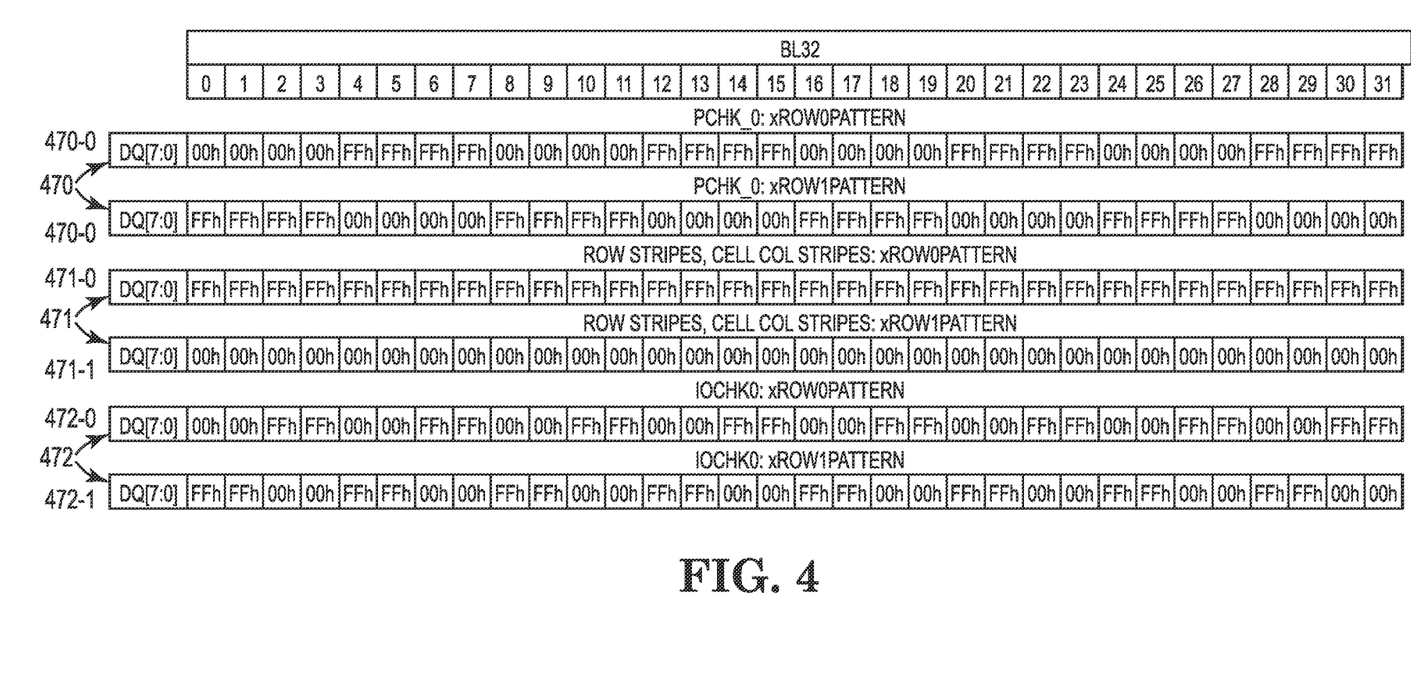
FIG. 4 illustrates example burst patterns used in association with BIST circuitry in accordance with a number of embodiments of the present disclosure.

FIG. 4 illustrates example burst patterns 470, 471, and 472 used in association with BIST circuitry in accordance with a number of embodiments of the present disclosure. The burst patterns 470, 471, and 472 can be used as write burst patterns (written to a memory device, such as one of the memory devices 222 described in association with FIG. 2) and/or read burst patterns (compared to data read from a memory device, such as one of the memory devices 222). The burst patterns 470, 471, and 472 are 32 bits long; however, embodiments are not so limited. For example, burst patterns can be less than 32 bits long (e.g., 16 bits) or greater than 32 bits long (e.g., 64 bits). The burst patterns 470, 471, and 472 can write to and/or read from a memory device via a DQ bus as indicated by DQ[7:0].

In contrast to the burst patterns 360-366 described in association with FIG. 3, the burst patterns 470, 471, and 472 can be used in pairs. A portion 470-0 of the burst pattern 470 can be written to and/or read from a row of a memory device and another portion 470-1 of the burst pattern 470 can be written to an adjacent row of the memory device. The portion 470-0 of the burst pattern 470 can be stored in WrRow0Pattern register of the registers 243 (when used as a write burst pattern) and/or RdRow0Pattern register of the registers 253 (when used as a read burst pattern). The portion 470-1 of the burst pattern 470 can be stored in WrRow1Pattern register of the registers 243 (when used as a write burst pattern) and/or RdRow1Pattern register of the registers 253 (when used as a read burst pattern). The burst pattern 470 can be referred to as a checkerboard pattern. For example, the portion 470-0 of the burst pattern 470 includes four zeroes (00 h) followed by four ones (FFh) repeating. The portion 470-1 of the burst pattern 470 is the complement of the portion 470-0.

A portion 471-0 of the burst pattern 471 can be written to and/or read from a row of a memory device and another portion 471-1 of the burst pattern 471 can be written to an adjacent row of the memory device. The portion 470-0 of the burst pattern 470 can be stored in WrRow0Pattern register of the registers 243 (when used as a write burst pattern) and/or RdRow0Pattern register of the registers 253 (when used as a read burst pattern). The portion 470-1 of the burst pattern 470 can be stored in WrRow1Pattern register of the registers 243 (when used as a write burst pattern) and/or RdRow1Pattern register of the registers 253 (when used as a read burst pattern). The portion 471-0 of the burst pattern 471 includes all ones (FFh) and the portion 471-1 of the burst pattern 471 includes all zeroes (00h).

A portion 472-0 of the burst pattern 472 can be written to and/or read from a row of a memory device and another portion 472-1 of the burst pattern 472 can be written to an adjacent row of the memory device. The portion 472-0 of the burst pattern 472 can be stored in WrRow0Pattern register of the registers 243 (when used as a write burst pattern) and/or RdRow0Pattern register of the registers 253 (when used as a read burst pattern). The portion 472-1 of the burst pattern 472 can be stored in WrRow1Pattern register of the registers 243 (when used as a write burst pattern) and/or RdRow1Pattern register of the registers 253 (when used as a read burst pattern). The burst pattern 472 can be referred to as an I/O checkerboard pattern. For example, the portion 472-0 of the burst pattern 470 includes two zeroes (00 h) followed by two ones (FFh) repeating. The portion 472-1 of the burst pattern 472 is the complement of the portion 472-0.

Some embodiments of the present disclosure can include performing, contemporaneously, a BIST operation on memory devices of a memory module using BIST circuitry of a controller of the memory module. Performing the BIST operation can include retrieving one or more burst patterns from one or more registers of the BIST circuitry. Performing the BIST operation can include performing a write operation or a read operation on the memory devices contemporaneously and using the burst patterns.

In some embodiments, performing a write operation in association with the BIST operation can include writing the burst patterns to the memory device. Performing the read operation in association with the BIST operation can include determining whether data read from the memory device matches the burst patterns. The burst patterns can be received from a host coupled to the controller and written to the registers. A media scan operation can be initiated by a host coupled to the memory module. Performing the BIST operation can be performed in association with performing the media scan operation.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a plurality of memory devices; and
a controller coupled to the plurality of memory devices and comprising built-in self-test (BIST) circuitry comprising a plurality of registers configured to store a number of burst patterns,
wherein the BIST circuitry is configured to perform a BIST operation on the plurality of memory devices contemporaneously and using the number of burst patterns; and
comparison circuity coupled to the BIST circuitry configured to:
compare data read from the plurality of memory devices with a selected read burst pattern; and
provide an indication of whether the data read from the plurality of memory devices corresponds to the selected read burst pattern.

2. The apparatus of claim 1, wherein at least one of the number of burst patterns is user-defined.

3. The apparatus of claim 1, wherein a first register of the plurality is configured to store a first write burst pattern associated with writing one, two, and four write burst patterns to the plurality of memory devices in association with the BIST operation, and
wherein a second register of the plurality is configured to store a second write burst pattern associated with writing two and four write burst patterns to the plurality of memory devices in association with the BIST operation.

4. The apparatus of claim 3, wherein a third register of the plurality is configured to store a third write burst pattern associated with writing four write burst patterns to the plurality of memory devices in association with the BIST operation, and
wherein a fourth register of the plurality is configured to store a fourth write burst pattern associated with writing four write burst patterns to the plurality of memory devices in association with the BIST operation.

5. The apparatus of claim 1, wherein a first register of the plurality is configured to store a first read burst pattern associated with using one, two, and four read burst patterns in association with the BIST operation, and
wherein a second register of the plurality is configured to store a second read burst pattern associated with using two and four read burst patterns in association with the BIST operation.

6. The apparatus of claim 5, wherein a third register of the plurality is configured to store a third read burst pattern associated with using four read burst patterns in association with the BIST operation, and wherein a fourth register of the plurality is configured to store a fourth read burst pattern associated with using four of the plurality of read burst patterns in association with the BIST operation.

7. The apparatus of claim 1, further comprising a System Management Bus (SMBus) coupled to the host and the controller,
wherein the SMBus is configured to communicate signaling indicative of a BIST command from the host to the controller.

8. The apparatus of claim 7, wherein the signaling is indicative of at least one of:
an address of the plurality of memory devices associated with the BIST operation; and
which of the number of burst patterns to use in association with the BIST operation.

9. The apparatus of claim 1, wherein the apparatus is a memory module that comprises a Compute Express Link (CXL) device.

10. The apparatus of claim 1, wherein the plurality of memory devices comprises a Dynamic Random Access Memory (DRAM) device.

11. The apparatus of claim 1, wherein the plurality of memory devices comprises a Ferroelectric Random Access Memory (FeRAM) device.

12. A method, comprising:
performing, using built-in self-test (BIST) circuitry of a controller of a memory module, a BIST operation on a plurality of memory devices of the memory module contemporaneously, wherein performing the BIST operation comprises:
retrieving several burst patterns from a number of registers of the BIST circuitry; and
performing a write operation or a read operation on the plurality of memory devices contemporaneously and using the number of burst patterns,
writing, in association with performing the write operation and at respective addresses of the plurality of memory devices, the number of burst patterns to the plurality of memory devices contemporaneously;
reading, in association with performing the read operation, data from the plurality of memory devices at the respective addresses; and
determining in association with performing the BIST operation, whether the data read from the plurality of memory devices matches the number of burst patterns.

13. The method of claim 12, wherein performing the write operation comprises writing the number of burst patterns to the plurality of memory devices contemporaneously.

14. The method of claim 12, wherein performing the read operation comprises determining whether data read from the plurality of memory devices matches the number of burst patterns.

15. The method of claim 12, further comprising performing a media scan operation initiated by a host coupled to the memory module, wherein performing the media scan operation comprises performing the BIST operation.

16. A system, comprising:
a host; and
a memory module coupled to the host and comprising:
a plurality of memory devices; and
a controller coupled to the plurality of memory devices and comprising:
a host interface configured to receive, from the host, a built-in self-test (BIST) command,
BIST circuitry coupled to the host interface and configured to:
generate a burst pattern according to the BIST command; and
perform a BIST operation on the plurality of memory devices contemporaneously and using the generated burst pattern;
wherein the controller further comprises a memory interface coupled to the BIST circuitry and the plurality of memory devices, and
error correction code (ECC) circuitry coupled to the BIST circuitry and the memory interface.

17. The system of claim 16, wherein the BIST circuitry is further configured to perform, contemporaneously, a plurality of types of BIST operations on the plurality of memory devices using a number of burst patterns other than the generated burst pattern.

18. The system of claim 17, wherein the BIST circuitry further comprises a control register configured to receive a bit string indicative of a particular one of the plurality of types of BIST operations and a particular one of the number of burst patterns, and
wherein the BIST circuitry is further configured to perform the particular one of the plurality of types of BIST operations using the particular one of the number of burst patterns.

19. An apparatus, comprising:
a plurality of memory devices; and
a controller coupled to the plurality of memory devices and comprising built-in self-test (BIST) circuitry comprising a plurality of registers configured to store a number of burst patterns, wherein the BIST circuitry is configured to perform a BIST operation on the plurality of memory devices contemporaneously and using the number of burst patterns,
wherein the controller further comprises:
a front-end portion coupled to the BIST circuitry and configured to interface with a host; and
a back-end portion coupled to the BIST circuitry and configured to interface with the plurality of memory devices.

20. A method, comprising:
performing, using built-in self-test (BIST) circuitry of a controller of a memory module, a BIST operation on a plurality of memory devices of the memory module contemporaneously, wherein performing the BIST operation comprises:
retrieving several burst patterns from a number of registers of the BIST circuitry; and
performing a write operation or a read operation on the plurality of memory devices contemporaneously and using the number of burst patterns;
wherein the number of burst patterns are received from a host coupled to the controller; and
wherein the method further comprises writing the burst patterns to the number of registers.

* * * * *